(12) United States Patent
Madsen et al.

(10) Patent No.: US 6,445,477 B1
(45) Date of Patent: Sep. 3, 2002

(54) SELF-MONITORED LIGHT SOURCE FOR STABLE WAVELENGTH OPTICAL COMMUNICATIONS

(75) Inventors: Christi Kay Madsen, South Plainfield; Julian Bernard Soole, Edison, both of NJ (US)

(73) Assignee: Lucent Technologies, Murray Hill, NJ (US)

( * ) Notice: Subject to any disclaimer, the term of this patent is extended or adjusted under 35 U.S.C. 154(b) by 0 days.

(21) Appl. No.: 09/248,648

(22) Filed: Feb. 11, 1999

(51) Int. Cl.[7] .............................................. H04B 10/04
(52) U.S. Cl. ........................ 359/187; 359/132; 359/133; 385/7; 385/8; 385/9; 385/14; 385/15; 385/27; 385/28; 372/6; 372/32; 372/64
(58) Field of Search ................................. 359/132, 133, 359/187; 385/14, 15, 7–9, 27, 28; 372/6, 32, 64

(56) References Cited

U.S. PATENT DOCUMENTS

| | | | | |
|---|---|---|---|---|
| 4,842,358 A | * | 6/1989 | Hall | 350/96.15 |
| 5,428,700 A | * | 6/1995 | Hall | 372/32 |
| 5,862,279 A | * | 1/1999 | Amersfoort et al. | 385/40 |
| 5,920,414 A | * | 7/1999 | Miyachi et al. | 359/133 |
| 6,084,992 A | * | 7/2000 | Weber et al. | 385/24 |
| 6,222,955 B1 | * | 4/2001 | Lagali et al. | 385/20 |
| 6,292,597 B1 | * | 9/2001 | Lagali et al. | 385/1 |

FOREIGN PATENT DOCUMENTS

JP 03253968 1/1991

OTHER PUBLICATIONS

Teshima M. et al: "Multiwavelength Simultaneous Monitoring Circuit Employing Wavelength Crossover Properties Arrayed–Waveguide Grating", Electronics Letters, GB, IEE Stevenage, vol. 31, Aug. 1995, pp. 1595–1597.

* cited by examiner

Primary Examiner—Jason Chan
Assistant Examiner—Dzung Tran
(74) Attorney, Agent, or Firm—Lowenstein Sandler, PC

(57) ABSTRACT

In accordance with the invention, a wavelength stable optical source comprises at least one adjustable wavelength optical source, a multipath Mach-Zehnder interferometer (MMZI) for receiving a signal from the adjustable source and providing a primary output and one or more secondary outputs, and a feedback arrangement responsive to the outputs for adjusting the wavelength source. Photodetectors coupled to the primary output and one or more of the secondary outputs provide feedback information for maintaining wavelength stability.

7 Claims, 2 Drawing Sheets

US 6,445,477 B1

SELF-MONITORED LIGHT SOURCE FOR STABLE WAVELENGTH OPTICAL COMMUNICATIONS

FIELD OF THE INVENTION

This invention relates to light sources for providing stable wavelength light for optical communication systems.

BACKGROUND OF THE INVENTION

Optical fiber communication systems are beginning to achieve their great potential for the rapid transmission of vast amounts of information. In essence, an optical fiber system comprises a light source, a modulator for impressing information on the light, an optical fiber transmission line for carrying the optical signals and a receiver for detecting the signals and demodulating the information they carry. The optical signals are typically within a wavelength range favorable for propagation within silica fibers and increasingly are wavelength division multiplexed (WDM) signals comprising a plurality of wavelength distinct wavelength channels within that range. Information is typically impressed upon the signal channels as by pulse code modulation.

Wavelength stability is important for the optical sources used in such systems. In contemplated systems, laser sources will be required to maintain their precise operating wavelengths over twenty years of field operation. It is doubtful that even the best current lasers can operate within the tight wavelength tolerances that projected wavelength channel spacings will require. Accordingly, there is a need for light sources with enhanced wavelength stability.

Mach-Zehnder waveguide interferometers for wavelength measurement have been proposed. See, for example, M. Teshima et al., "Multiwavelength simultaneous monitoring circuit employing wavelength crossover properties of arrayed waveguide grating", *Electronics Letters,* 31, pp. 1595–97 (1995). The difficulty with such devices, however, is that they are relatively inefficient, bulky, and not readily incorporated into a light source.

SUMMARY OF THE INVENTION

In accordance with the invention, a wavelength stable optical source comprises at least one adjustable wavelength optical source, a multipath Mach-Zehnder interferometer (MMZI) for receiving a signal from the adjustable source and providing a primary output and one or more secondary outputs, and a feedback arrangement responsive to the outputs for adjusting the wavelength source. Photodetectors coupled to the primary output and one or more of the secondary outputs provide feedback information for maintaining wavelength stability.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for the graphs, are not to scale.

DETAILED DESCRIPTION

Figure 1:
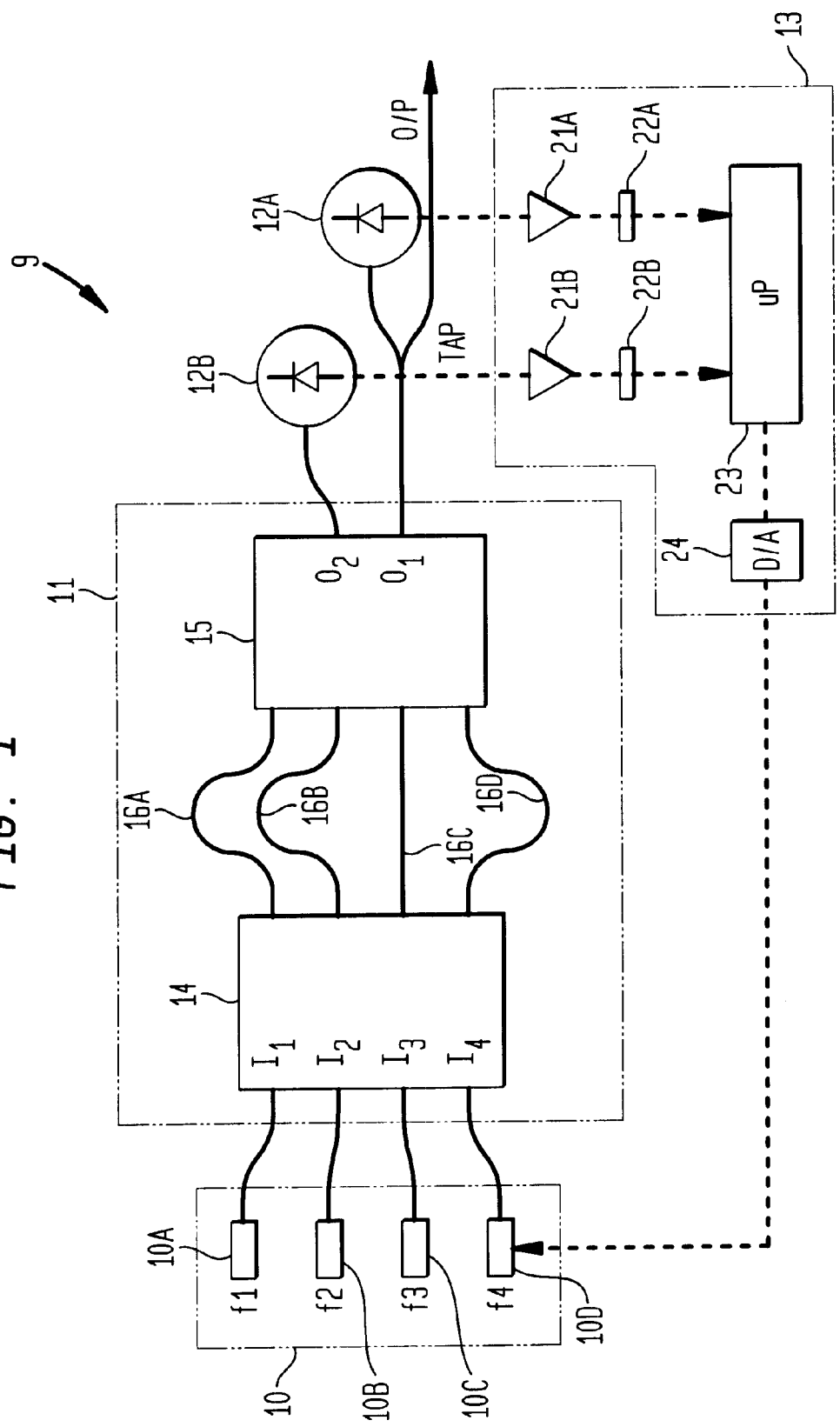
FIG. 1 illustrates a wavelength-stable optical source.

Referring to the drawings, FIG. 1 illustrates a wavelength stable optical source 9 comprising at least one adjustable optical source 10, a multipath Mach-Zehnder interferometer (MMZI) 11, a plurality of photodetectors 12A, 12B for monitoring outputs of the interferometer 11 and a feedback circuit 13 for adjusting the operating wavelength of the adjustable source 10. The multipath Mach-Zehnder interferometer comprises a pair of multimode couplers and a multiplicity (three or more) of waveguide paths of different optical pathlength between the couplers. Each multimode coupler images an input into a plurality of outputs differing in phase. All of these components are conveniently provided on or within a silica waveguiding platform such as a silica-coated silicon substrate.

The adjustable wavelength source 10 is conveniently an array of wavelength adjustable lasers 10A–10D. Each laser can produce an optical output of at least one distinct frequency (and thus at least one distinct wavelength channel). The frequencies $f_1, f_2, \ldots f_4$ are advantageously spaced apart to provide desirably spaced distinct wavelength optical communication channels.

The MMZI 11 preferably comprises a pair of multimode interference couplers (MMI couplers) 14 and 15 coupled via four optical pathlength waveguide arms 16A–16D. The MMI couplers are conveniently slab planar waveguiding devices formed in a silica waveguiding platform, and the arms 16A, 16B, . . . can be buried optical waveguides defined in the silica. These buried waveguides are typically designed to be single mode for the wavelengths they are to transmit. The design of silica waveguiding platforms and buried waveguides is described in "Silicon Optical Bench Waveguiding Technology" by Y. P. Li and C. H. Henry, Chapter 8 of *Optical Fiber Telecommunications,* Vol. IIIB (Editors I. P. Kaminov and T. L. Koch) (Academic Press, 1997).

The MMI couplers 14, 15 are designed in accordance with self-imaging principles well known in the art, to present at each output port an image of each signal received at an input port. See R. Ulrich in *Optical communications* 13, pp.259–264 (1975); L. B. Soldano and E. C. M. Pennings in *J. Lightwave Tech.,* 13, pp. 615–627 (1995); and M. Bachmann et al. in *Applied Optics,* 33, pp. 3905–3911 (1994). The MMZI comprises two such couplers connected by waveguides of differing optical pathlengths. It is designed to receive the distinct frequencies $f_1, f_2, \ldots f_4$ at distinct input ports $I_1, I_2, \ldots I_4$ to and present their combined output at a primary output port $O_1$. Portions of each of the input signals will also be presented at secondary output ports e.g. $O_2$. Design of such frequency-dependent transmission devices is described, for example, in M. R. Paiam et al, "Design of phased-array wavelength division multiplexers using multimode interference couplers", *Applied Optics,* 36 pp. 5097–5108 (1997).

The particular MMZI 11 shown in FIG. 1 is an N×N (4×4) MMI Mach-Zehnder interferometer. This design is described by P. A. Besse et al. in "The Integrated prism interpretation of multileg Mach-Zehnder interferometers based on multimode interference couplers", *Optical and Quantum Electronics,* 27, pp. 909–920 (1995).

For a given laser, e.g. laser 10A desirably operating at frequency fi, the proportion of the laser output presented at the primary output $O_1$ as compared with the portion on a secondary output, e.g. $O_2$ is a function of how closely the actual frequency of the laser conforms to its operating value $f_1$. Thus photodetectors 12A, 12B coupled to $O_1$ and $O_2$, respectively, can monitor power levels related to the laser wavelength. The photodetector outputs, in turn, can be applied to feedback circuit 13 for adjusting the laser frequency. The lasers can advantageously be scanned one at a time for the adjustment of each.

A typical feedback circuit 13 uses two photodiodes 12A, 12B as front ends of separate transimpedance amplifiers 21A, 21B. Each amplifier outputs its signal via an analog to digital converter (ADC) 22A, 22B to a microprocesser 23 which, via a digital to analog converter (DAC) 24, controls the lasers 10A–10D. The frequency control can be achieved by control of the laser temperature through adjustment of the current supplied to a thermoelectric cooler element. Alternately, in some advanced laser designs, wavelength tuning may be directly achieved by changing the current supplied to a wavelength-tuning electrode on the laser structure. In addition to the two photodetectors 12A, 12B shown in FIG. 1, a third photodetector might be employed on a third output port $O_3$ to provide enhanced wavelength accuracy.

While FIG. 1 depicts a digital feedback control circuit, alternatively, direct analog feedback can be employed. A practical implementation of the feedback control circuit might entail initially normalizing the detector photocurrents to the photodetector 12A signal.

Upon occasion it may be advantageous to offset the passband center of the multimode interferometer device from precise coincidence with a desired laser frequency. This is because some practical realizations of the interferometer device may not afford the predicted narrow-band frequency null but instead provide a broad minimum over a frequency range larger than the desired operating frequency of the laser. Offsetting the passband center moves the signal P2 from the broad minimum so that P2 will change measurably as the laser frequency deviates from its desired operating value. Evaluation of P1/P2 will give a sensitive measure of this deviation, and activation of feedback control will allow accurate maintenance of laser frequency.

Figure 2:
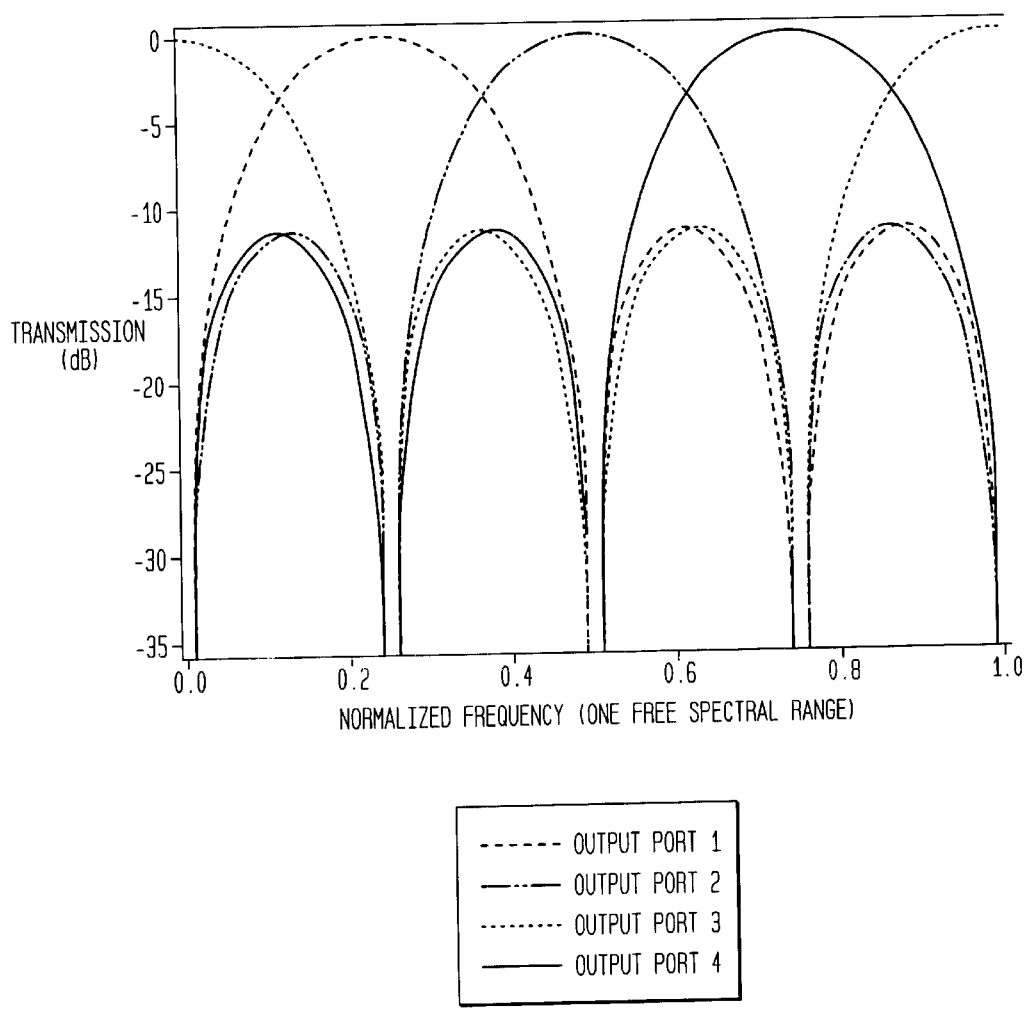
FIG. 2 is a graphical illustration showing the relative power transmitted from the outputs of the FIG. 1 device.

FIG. 2 is a graphical illustration showing the relative power transmitted from the different outputs of device 11 for an input signal at one input. The transmission function is periodic in frequency for a given output port and a single input port. Knowledge of the relative powers emerging from the different output ports permits determination of the frequency of the input signal. Within the limits provided by the periodicity, the relative power received by photodetectors 12A, 12B accurately reflects the laser frequency and can be used with feedback control to maintain it within required tolerance.

In typical application, the ordering of the lasers in the array and the design of the multimode interferometer are such that when the lasers operate at their desired frequencies, the transmission from the primary output is substantially maximized. A fixed and small constant fraction of this output signal is tapped, passed to the photodetector 12A, and measured as power level P1. The remainder continues as output. Power from a secondary output port is passed to the second photodetector 12B and measured as P2. When the laser frequency is close to its desired value, the signal from the second photodetector is small. It is determined by practical imperfections in the laser and the interferometer. By measuring the ratio of the signals P1/P2, the excursion of the laser frequency from its desired value may be determined. By determining a threshold maximum value for this excursion and establishing a feedback mechanism to change the laser operating frequency when this value rises above threshold, the laser frequency may be maintained in close proximity of its desired value.

Measurement by photodetector 12A alone monitors against a reduction in the laser output power or a decrease in the coupling efficiency between the laser and the interferometer 11.

In an alternative application one or more of lasers 10A–10D operate at a plurality of different frequencies. In this case the lasers are still ordered in an array, but the MMI device is designed to have a broader passband so that it passes a substantial fraction of the laser power irrespective of which desired frequencies the laser is emitting. A small constant fraction of the power from the primary output port is tapped and measured by a photodetector as P1. The power transmitted to a secondary port is passed to a second photodetector and measured as P2. The measured ratio P1/P2 corresponding to laser operation at desired frequencies is thus determined and can be bracketed by maximum and minimum thresholds for adjustment.

It is seen from FIG. 2 that the P1/P2 ratio corresponding to the desired frequency might not be unique. For example, in FIG. 2 the power from outputs 1 and 4 bear the same ratio at four frequency values within the frequency period represented by the diagram. However, the sign of the change in output power levels with frequency is different in each case. By examining whether the power signal increases or decreases as the laser frequency is slightly changed thus allows the laser frequency to be uniquely determined.

In an alternative embodiment, the adjustable source 10 can comprise a single laser and the first MMI coupler 14 can be a 1×N multimode imaging coupler. This provides a highly compact device.

The optical source of FIG. 1 can be formed by hybrid integration or by monolithic integration. Realization using hybrid integration permits maximal optimization of the individual components. Realization by monolithic integration provides compactness and ease of packaging. In a hybrid realization the multimode interferometer is typically formed from a separate material system from the laser and photodetectors. A silica platform including a silica planar waveguide structure is advantageous. In this case, the laser elements and the photodetectors may be mounted on the platform. It is recognized that the waveguiding system comprising the interferometer provides a frequency transmission that will be temperature dependent according to the temperature dependence of the refractive index of the waveguiding elements. In the case of a typical silica waveguide platform, this sensitivity is approximately 0.01 nm/C. Temperature control of the waveguiding structure can therefore be employed for high wavelength stability.

In the monolithic approach, the interferometric portion of the combined structure should be maintained at a constant known temperature while the feedback circuit provides control of the laser frequencies. The interferometer and waveguiding elements can be formed in the same material system as the lasers and the detectors, e.g. in a InP/InGaAsP semiconductor substrate. A 4×4 MMI Mach-Zehnder wavelength multiplexer realized on the InP/InGaAsP waveguiding platform is described by C. van Dam et al. in *European Conference on Integrated Optics, ECIO '94.* Conference Proceedings, pp. 275–79, (1994).

As contrasted with the devices of Teshima et al., cited above, in the present invention the slab waveguide regions connected by the multiple paths of the interferometer are multimode couplers operating under the principles of self-imaging. This provides an interferometer device which can be more efficient in the transmission of the input signal to the output because the input light is imaged directly onto the entrance of the connecting waveguides. And the device can be more readily fabricated with known interferometric properties because the relative phases of the signals are well determined. In addition, the device provides a more compact structure.

It is to be understood that the above described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

What is claimed is:

1. An optical light source for providing stable wavelength light comprising:
    a wavelength adjustable source of optical signals comprising a plurality of lasers operating at a plurality of different frequencies;
    a multipath Mach-Zehnder interferometer comprising a first multimode coupler, a second multimode coupler and at least three waveguide lightpaths between said couplers, said first coupler having an input optically coupled to said adjustable light source, said waveguide light paths providing respectively different optical pathlengths, and said second coupler having a plurality of outputs;
    a plurality of photodetectors optically coupled to at least two outputs of said interferometer for measuring the optical power from said outputs; and
    a feedback circuit responsive to said photodetectors for adjusting the wavelength of said adjustable source to stabilize its operating wavelength.

2. A light source according to claim 1 wherein said first multimode coupler is an N×N multimode coupler.

3. A light source according to claim 1 wherein each laser is adjustable in operating frequency.

4. A light source according to claim 1 implemented as a hybrid device.

5. A light source according to claim 4 implemented on a silica waveguiding platform.

6. A light source according to claim 1 implemented as a monolithic device.

7. A light source according to claim 6 implemented on an InP/InGaAsP waveguiding platform.

* * * * *